United States Patent
Chang

(10) Patent No.: US 7,788,528 B2
(45) Date of Patent: Aug. 31, 2010

(54) REPAIR MODULE FOR MEMORY, REPAIR DEVICE USING THE SAME AND METHOD THEREOF

(75) Inventor: Yaw-Guang Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 322 days.

(21) Appl. No.: 12/126,231

(22) Filed: May 23, 2008

(65) Prior Publication Data

US 2009/0292946 A1 Nov. 26, 2009

(51) Int. Cl.
*G06F 11/00* (2006.01)
(52) U.S. Cl. ........................... 714/7; 365/210.1
(58) Field of Classification Search ............ 714/7, 714/8, 42, 54, 710, 711, 718; 365/189.17, 365/189.02, 200, 201, 210.1
See application file for complete search history.

(56) References Cited

U.S. PATENT DOCUMENTS

| | | | | |
|---|---|---|---|---|
| 5,051,957 A | * | 9/1991 | Yamauchi | 365/190 |
| 5,349,555 A | * | 9/1994 | Nakajima | 365/200 |
| 6,580,653 B2 | * | 6/2003 | Yamanaka | 365/210.1 |
| 7,224,596 B2 | * | 5/2007 | Jeong et al. | 365/63 |
| 2005/0285862 A1 | * | 12/2005 | Noda et al. | 345/502 |

* cited by examiner

*Primary Examiner*—Dieu-Minh Le
(74) *Attorney, Agent, or Firm*—J.C. Patents

(57) ABSTRACT

A repair module for repairing one of n bit lines through m bit bus in a memory, a repair device using the same, and a method thereof are provided herein, wherein m≧n. In the repair method, a switching control signal and a selecting control signal are generated according to an index value of the one of n bit lines. A dummy line is switched to the one of n bit lines by shifting from $1^{st}$ bit line to the one of n bit line one by one according to the switching control signal for replacing the one of n bit lines. Then, the $L^{th}$ bit line or the dummy line is selected for signal transmission according to the selecting control signal, wherein 1≦L≦m. Therefore, the data can be transmitted through the undamaged bit line by replacing the defective bit line with the dummy line.

12 Claims, 3 Drawing Sheets

REPAIR MODULE FOR MEMORY, REPAIR DEVICE USING THE SAME AND METHOD THEREOF

BACKGROUND OF THE INVENTION

1. Field of Invention

The present invention relates to a repair device for a memory, and more particularly, to a device that repairs the defective bit lines of the memory.

2. Description of the Related Art

With great advance of science and technology, the electronic products, such as computer, cell phone, digital camera or personal digital assistant (PDA), are the common equipments for human to process and record data in daily life. The memory plays an important role in the said electronic products. With regard to the computer, the data, such as drivers or application programs, are loaded to the memory for the central processing unit (CPU) to access and execute the data. The memory temporarily stores the data for accelerating the operation of the computer.

As known, the memory includes a plurality of memory cells with array arrangement. When a row address is decoded, a word line corresponding to the row address is asserted so as to turn on the memory cells in the word line. When a column address is decoded, the bit line(s) corresponding to the column address can be selected for reading data from the memory to the bus or writing data transmitted through the bus to the memory. If one of the bit lines is defective, the data may not be transmitted to the destination so that a repair method should be developed for increasing the yield of the memory.

The simple way to repair the memory is to replace the defective bit line with a dummy line. Nevertheless, every bit line corresponds to a certain address in the memory so that a combination logic unit is needed for addressing the dummy line, and the complex register transfer language (RTL) code for addressing the dummy line causes huge gate count after synthesized. Once the dummy line is addressed to replace the defective bit line, the dummy line can not be reused. The bus bandwidth determines the maximum data size that can be transmitted once, or namely, determines how many bit lines can be selected in once transmission period. If there are several defective bit lines and they are utilized for transmitting data in different transmission periods, the way to utilize the un-reused dummy line doesn't conform to cost-benefit.

SUMMARY OF THE INVENTION

The invention provides a repair module and a repair method thereof that replaces one of the bit lines in the memory with a dummy line by shifting the dummy line from the initial bit line to the one of the bit lines one by one. Not only can ensure the smoothness of data transmission, but also the yield of the memory can be increased. Besides, the invention also provides a repair device practiced by cascading a plurality of the said repair modules in number of n for repairing n bit lines in the memory.

The repair module for a memory is provided to repair one of n bit lines through m bit bus in the present invention, wherein $m \geq n$. The repair module includes a decoding unit, a plurality of switching units and a plurality of multiplexers. The decoding unit generates a switching control signal and a selecting control according to an index value of the one of the n bit lines. The first and the second input terminal of the $1^{st}$ switching unit are respectively coupled to the $1^{st}$ bit line and a dummy line. The first and the second input terminal of the $i^{th}$ switching unit are respectively coupled to the $i^{th}$ bit line and a first output terminal of the $(i-1)^{th}$ switching unit, wherein $2 \leq i \leq m$. Each switching unit respectively conducts the first and the second input terminals to the first and the second output terminals, or to the second and the first output terminals according to the switching control signal. The first and the second input terminals of the $j^{th}$ multiplexer are respectively coupled to the second output terminal of the $(j+1)^{th}$ switching unit and the second output terminal of the $j^{th}$ switching unit, wherein $1 \leq j \leq m-1$. The first and the second input terminals of the $m^{th}$ multiplexer are respectively coupled to the first and the second output terminals of the $m^{th}$ switching unit. Each multiplexer selects a bit line of the first input terminal thereof or a bit line of the second input terminal thereof for signal transmission according to the selecting control signal.

The repair device for a memory is provided to repair n bit lines through m bit bus in the present invention. The repair device includes a plurality of the said repair modules cascaded in number of n for repairing n bit lines, wherein $m \geq n$.

The repair method for a memory is provided in the present invention for repairing one of n bit lines through m bit bus, wherein $m \geq n$. First, a switching control signal and a selecting control signal are generated according to an index value of the one of the n bit lines. A dummy line is switched to replace the one of n bit lines by shifting the dummy line from $1^{st}$ bit line to the one of n bit lines one by one according to the switching control signal. The $L^{th}$ bit line or the dummy line is selected for signal transmission according to the selecting control signal, wherein $1 \leq L \leq m$.

The present invention provides a repair module for a memory that utilizes the switching units to shift the dummy line from the initial bit line to the one of n bit lines one by one. Then, the repair module utilizes each multiplexer to select the corresponding bit line or the dummy line for signal transmission. Therefore, a defective bit line can be replaced with the dummy line for ensuring the smoothness of data transmission and increasing the yield of the memory.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
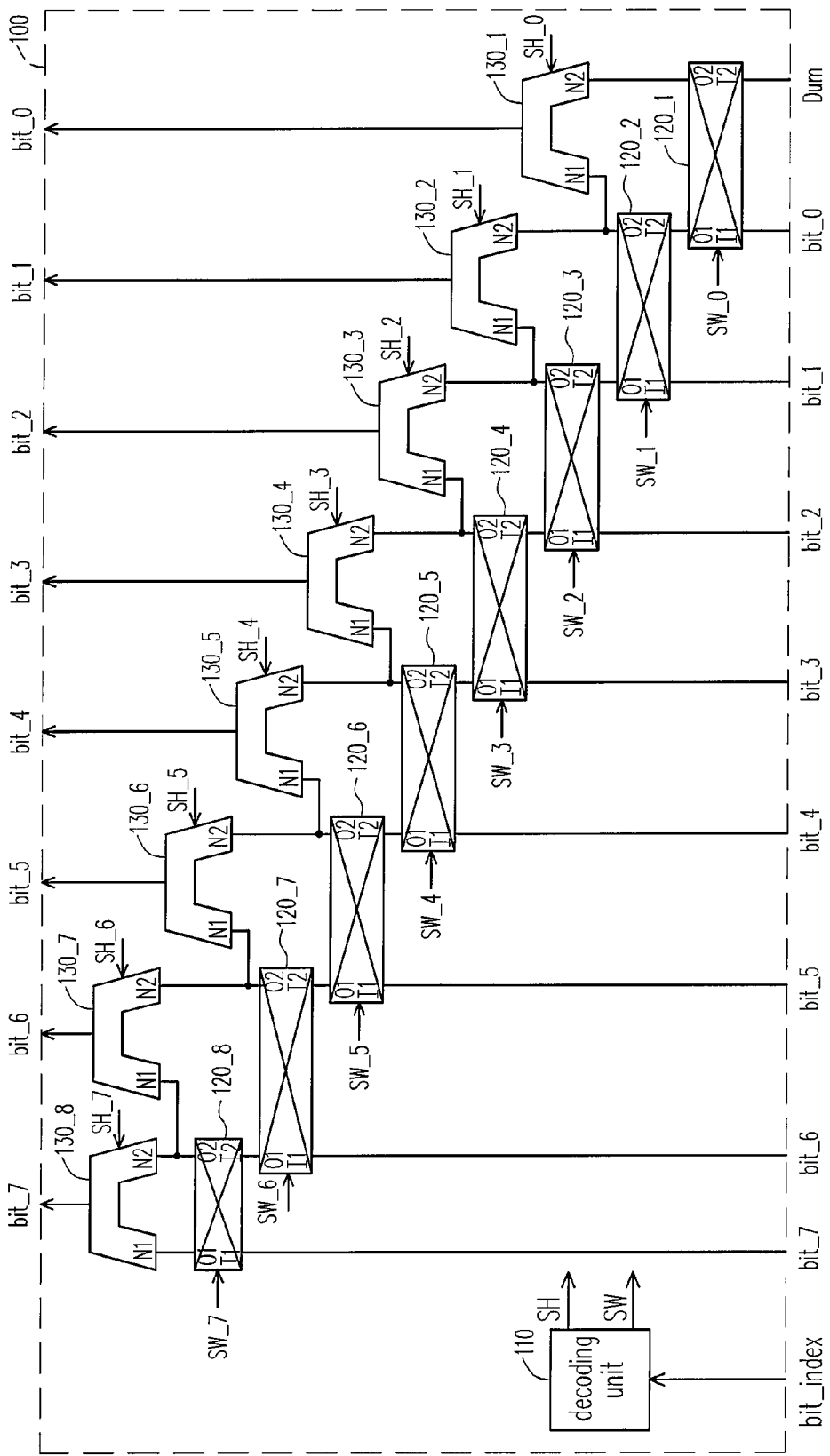
FIG. 1 is a block diagram of a repair module for a memory according to an embodiment of the present invention.

FIG. 1 is a block diagram of a repair module according to an embodiment of the present invention. Referring to FIG. 1, the repair module 100 is used for repairing one of n bit lines of a memory through m bit bus, wherein $m \geq n$. The memory, for example, is a static random access memory (SRAM). It is assumed that the bus bandwidth is 8 bits, i.e. m=8, and there are 4 bit lines through the bus needs to be repaired in the memory, i.e. n=4. The repair module 100 includes a decoding unit 110, a plurality of switching units 120_1 through 120_8, and a plurality of multiplexer 130_1 through 130_8, wherein the number of the switching units or the multiplexers is related to the bus bandwidth. When the memory is accessed, the data can be read from the memory to the bus or written to the memory from the bus via the bit lines bit_0 through bit_7. If one of the bit lines bit_0 through bit_7 is defective, the data may not be transmitted to the destination so that the embodiment provides the repair module 100 to repair the defective bit line.

The decoding unit 110 generates a switching control signal SH and a selecting control signal SH according to an index value of the one of the bit lines. In the embodiment, the switching control signal SW includes 8 bits, and the bit signals of the switching control signal SW are respectively denoted as SW_0 through SW_7 for controlling the operation of the switching units 120_1 through 120_8. The selecting control signal SH also includes 8 bits, and the bit signals of the selecting control signal SH are respectively denoted as SH_0 through SH_7 for controlling the operation of the multiplexer 130_1 through 130_8.

Each of the switching units 120_1 through 120_8 has a first input terminal I1, a second input terminal I2, a first output terminal O1 and a second output terminal O2. The first input terminal I1 and the second input terminal I2 of the $1^{st}$ switching unit 120_1 are respectively coupled to the $1^{st}$ bit line bit_0 and a dummy line Dum. The first input terminal I1 and the second input terminal I2 of the $i^{th}$ switching unit 120_1 are respectively coupled to the $i^{th}$ bit line bit_(i−1) and the first output terminal O1 of the $(i−1)^{th}$ switching unit 120_(i−1), wherein $2 \leq i \leq 8$. Each of the switching units 120_1 through 120_8 respectively conducts the first input terminal I1 and the second input terminal I2 to the first output terminal O1 and the second output terminal O2 or respectively conducts the first input terminal I1 and the second input terminal I2 to the second output terminal O2 and the first output terminal O1 according to the switching control signal SW.

Each of the multiplexers 130_1 through 130_8 has a first input terminal N1 and a second input terminal N2. The first input terminal N1 and the second input terminal N2 of the $j^{th}$ multiplexer 130_j are respectively coupled to the second output terminal O2 of the $(j+1)^{th}$ switching unit 120_(j+1) and the second output terminal O2 of the $j^{th}$ switching unit 120_j, wherein $1 \leq j \leq 7$. Besides, the first input terminal N1 and the second input terminal N2 of the $8^{th}$ multiplexer 130_8 are respectively coupled to the first output terminal O1 and the second output terminal O2 of the $8^{th}$ switching unit 120_8. Each of the multiplexers 130_1 through 130_8 selects a bit line of the first input terminal N1 thereof or a bit line of the second input terminal N2 thereof for signal transmission according to the selecting control signal SH.

For example, it is assumed that the defective bit line is the bit line bit_3 so that the index value of the bit line bit_3 is 3. The dummy line Dum will be switched to replace the bit line bit_3 by shifting the dummy line Dum from the $1^{st}$ bit line bit_0 to the bit line bit_3 one by one. The decoding unit 110 generates the switching control signal SW, whose bit signals SW_7 through SW_0 are respectively "0", "0", "0", "0", "1", "1", "1", "1", according to the index value of the bit line bit_3, wherein "1" represents logic high level and "0" represents logic low level. The $L^{th}$ switching unit 120_L respectively conducts the first input terminal I1 and the second input terminal I2 to the first output terminal O1 and the second output terminal O2 when the $L^{th}$ bit signal SW_(L−1) of the switching control signal SW has a first logic level, e.g. logic low level "0", wherein $1 \leq L \leq 8$. The $L^{th}$ switching unit 120_L respectively conducts the first input terminal I1 and the second input terminal I2 to the second output terminal O2 and the first output terminal O1 when the $L^{th}$ bit signal SW_(L−1) of the switching control signal SW has a second logic level, e.g. logic high level "1", and it is called switching operation. According to the said switching control signal SW, the switching units 120_1 through 120_4 perform the switching operation since the bit signals SW_0 through SW_3 has logic high level "1" so that the dummy line Dum can be switched to replace the bit line bit_3.

Besides, each of the multiplexers 130_1 through 130_8 selects the bit line of the first input terminal N1 or the bit line of the second input terminal N2 for signal transmission according to the selecting control signal SH. The decoding unit 110 generates the selecting control signal SH, whose bit signals SH_7 through SH_0 are respectively "0", "0", "0", "0", "0", "1", "1", "1", according to the index value of the bit line bit_3. The $L^{th}$ multiplexer 130_L selects the bit line of the first input terminal N1 thereof for signal transmission when the $L^{th}$ bit signal SH_(L−1) of the switching control signal SH has the first logic level, e.g. logic low level "0". The $L^{th}$ multiplexer 130_L selects the bit line of the second input terminal N2 thereof for signal transmission when the $L^{th}$ bit signal SH_(L−1) of the switching control signal SH has the second logic level, e.g. logic high level "1". According to the said selecting control signal SH, each of the multiplexers 130_1 through 130_3 selects the bit line of the second input terminal N2 for signal transmission since the bit signals SH_0 through SH_2 has logic high level "1". Besides, each of the multiplexers 130_4 through 130_8 selects the bit line of the first input terminal N1 for signal transmission since the bit signals SH_3 through SH_7 has logic low level "0".

Simply speaking, since the switching unit 120_1 switches the dummy line Dum and the bit line_0, the multiplexer 130_1 should select the bit line of the second terminal N2 as the origin bit line bit_0, and so do the multiplexers 130_2 and 130_3 since each of the switching unit 120_2 and 120_3 sequentially switch the dummy line Dum and the corresponding bit line. After the switching operation of the switching unit 120_3, the switching unit 120_4 switches the dummy line Dum and the defective bit line bit_3 so that the multiplexer 120_4 should select the bit line of the first input terminal N1, i.e. the dummy line Dum, as the newest bit line bit_3. Since the switching units 120_5 through 120_8 do not perform the switching operation, each of the corresponding multiplexers 130_5 through 130_8 selects the bit line of the first input terminal N1 as the origin corresponding bit line. Therefore, the repair module 100 can repair one of n bit lines through m bit bus for the memory.

Figure 2:
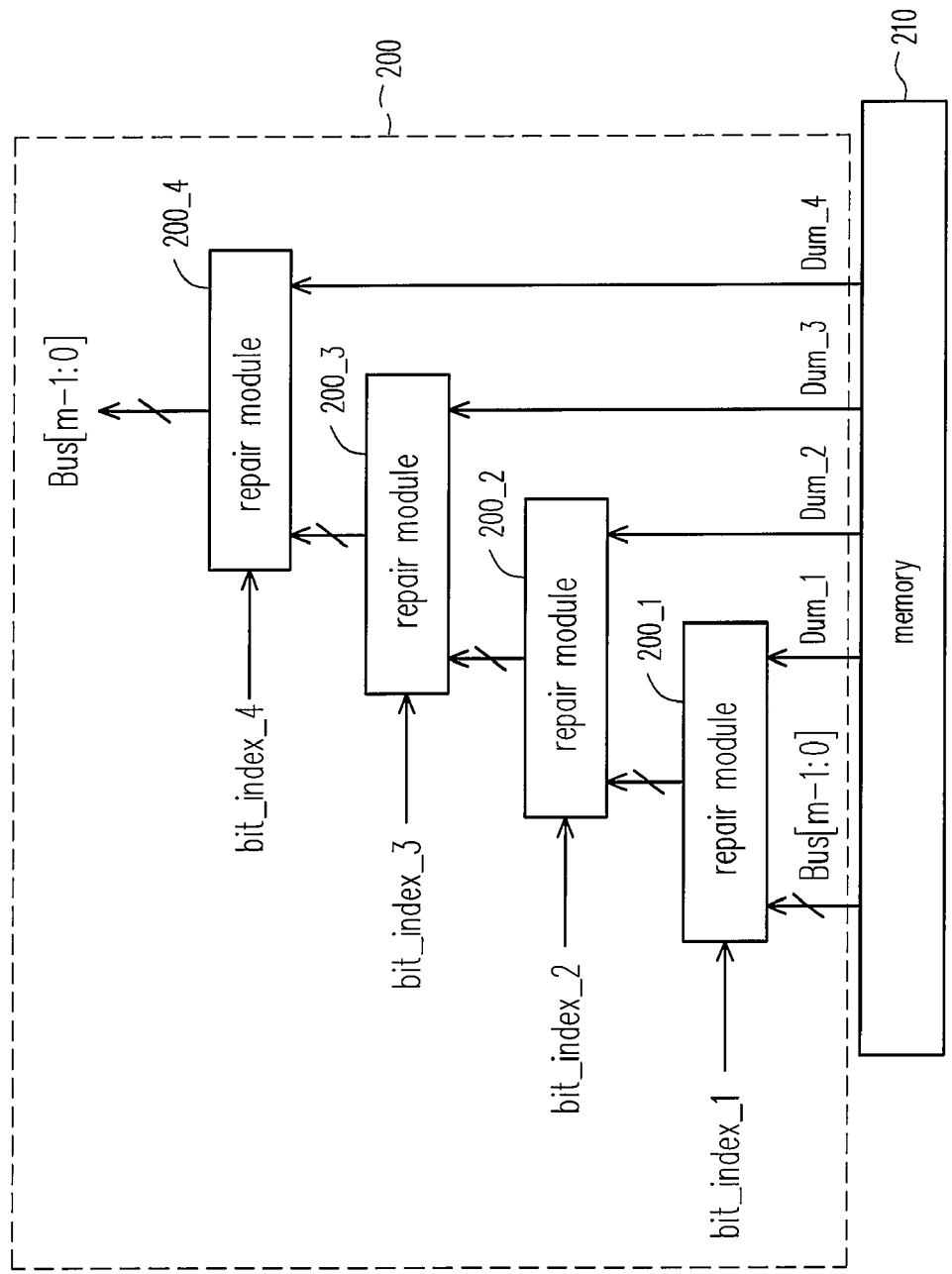
FIG. 2 is a block diagram of a repair device for a memory according to an embodiment of the present invention.

FIG. 2 is a block diagram of a repair device according to an embodiment of the present invention. Referring to FIG. 2, the repair device 200 includes a plurality of repair modules cascaded in the number of n for repairing n bit lines through the m bit bus Bus[m−1:0]. In the embodiment, there are four repair modules 200_1 through 200_4 shown in FIG. 2 for repairing 4 bit lines through the bus, wherein the bus bandwidth, for example, is 8 bits, i.e. m=8. Referring to FIG. 1 and FIG. 2, each of the repair modules 200_1 through 200_4 is implemented by the repair module 100. Referring the operation description of the repair module 100, the repair module 200_1 replaces one of the four defective bit lines, which corresponds to the index value bit_index_1, with the dummy line Dum_1, the repair module 200_2 replaces another of the four defective bit lines, which corresponds to the index value bit_index_2, with the dummy line Dum_2, and so forth until the repair module 200_4 replaces the other of the four defective bit lines, which corresponds to the index value bit_index_4, with the dummy line Dum_4.

It is noted that the bus bandwidth determines the maximum data size that can be transmitted through the bus once. The embodiment in FIG. 2 describes that n bit lines of the memory 120 can be repaired in once bus transmission. The repair device 200 can reuse the dummy lines Dum_1 through Dum_4 to repair n bit lines of memory in another bus transmission.

Figure 3:
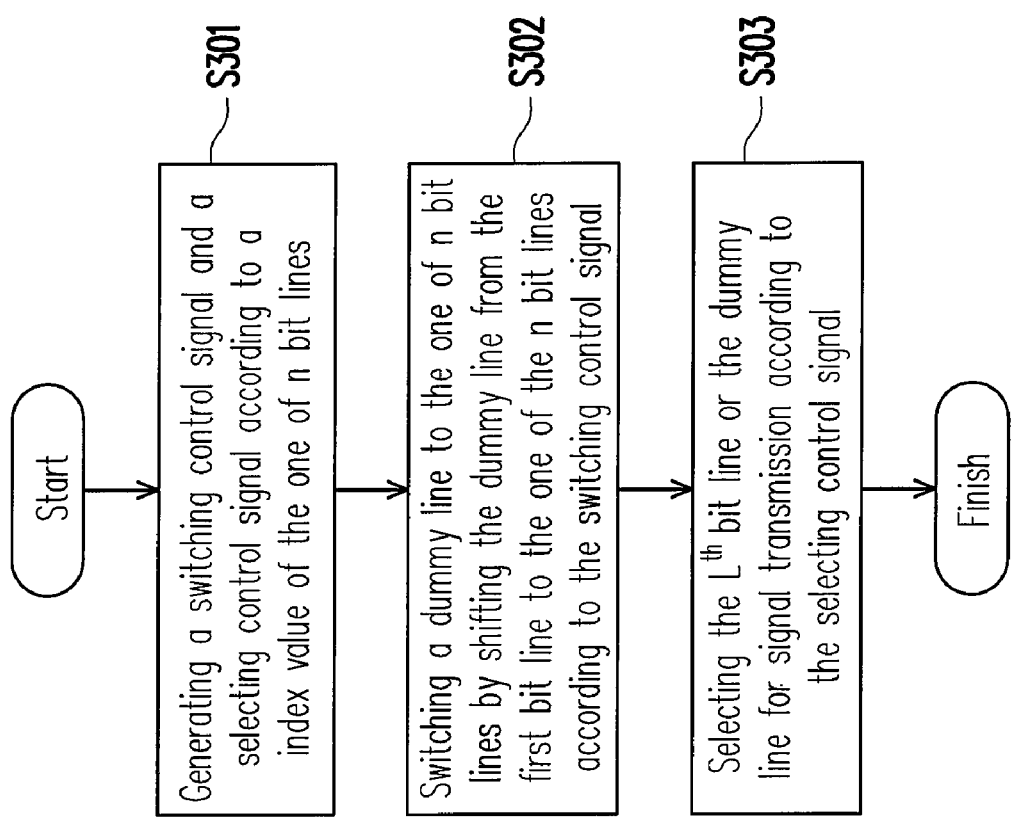
FIG. 3 is a flow chart of a repair method for a memory according to an embodiment of the present invention.

According to the embodiment described above, the steps of the following method could be generalized. FIG. 3 is a flow chart of a repair method for a memory according to an embodiment of the present invention. Referring to FIG. 1 and FIG. 3, in step S301, the switching control signal SW and the selecting control signal SH are generated according to an index value bit_index of the one of n bit lines. In step S302, a dummy line Dum is switched to the one of n bit lines by shifting the dummy line Dum from the first bit line to the one of the n bit lines one by one according to the switching control signal SW. In step S303, the $L^{th}$ bit line or the dummy line Dum is selected for signal transmission according to the selecting control signal SH.

In summary, the repair module in the said embodiment repairs one of n bit lines of the memory through m bit bus by switching the dummy line to the one of n bit lines. By utilizing the switching units, the dummy line is shifted from the first bit line to the one of n bit line and is utilized to replace the one of n bit lines. Cooperating with the multiplexers, the undefected bit lines can be selected for signal transmission. The repair device composed of a plurality of cascaded repair modules can repair n bit lines of the memory through m bit bus. Therefore, the defective bit lines can be repaired for ensuring the data smoothly transmitted through the bus.

If there is more than one defective bit line that needs to be repaired, the said repair modules 100 can be cascaded in number of n for repairing n bit lines through the m bit bus.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A repair module adapted to a memory for repairing one of n bit lines through m bit bus, $m \geq n$, and comprising:
  a decoding unit, generating a switching control signal and a selecting control signal according to an index value of the one of the n bit lines;
  a plurality of switching units, each of the switching units having a first input terminal, a second input terminal, a first output terminal and a second output terminal, the first and the second input terminals of the $1^{st}$ switching unit respectively coupled to the $1^{st}$ bit line and a dummy line, the first and the second input terminals of the $i^{th}$ switching unit respectively coupled to the $1^{st}$ bit line and the first output terminal of the $(i-1)^{th}$ switching unit, $2 \leq i \leq m$, wherein each of the switching units conducts the first and the second input terminals to the first and the second output terminals respectively, or conducts the first and the second input terminals to the second and the first output terminals respectively according to the switching control signal; and
  a plurality of multiplexers, each of the multiplexers having a first input terminal and a second input terminal, the first and the second input terminals of the $j^{th}$ multiplexer respectively coupled to the second output terminal of the $(j+1)^{th}$ switching unit and the second output terminal of the $j^{th}$ switching unit, $1 \leq j \leq m-1$, the first and the second input terminals of the $m^{th}$ multiplexer respectively coupled to the first and the second output terminals of the $m^{th}$ switching unit, wherein each of the multiplexers selects a bit line of the first input terminal thereof or a bit line of the second input terminal thereof for signal transmission according to the selecting control signal.

2. The repair module as claimed in claim 1, wherein the switching control signal comprises m bits, the $L^{th}$ switching unit conducts the first and the second input terminals thereof to the first and the second output terminals thereof respectively when the $L^{th}$ bit signal of the switching control signal has a first logic level, and the $L^{th}$ switching unit conducts the first and the second input terminals thereof to the second and the first output terminals thereof respectively when the $L^{th}$ bit signal of the switching control signal has a second logic level, and $1 \leq L \leq m$.

3. The repair module as claimed in claim 1, wherein the selecting control signal comprises m bits, the $L^{th}$ multiplexer selects the bit line of the first input terminal thereof when the $L^{th}$ bit signal of the selecting control signal has a first logic level, and the $L^{th}$ multiplexer selects the bit line of the second input terminal when the $L^{th}$ bit signal of the selecting control signal has a second logic level, and $1 \leq L \leq m$.

4. The repair module as claimed in claim 1, wherein the memory is static random access memory.

5. A repair device adapted to a memory, comprising a plurality of repair modules cascaded in number of n for repairing n bit lines through m bit bus, $m \geq n$, wherein the $k^{th}$ repair module, $1 \leq k \leq n$, comprises:
  a decoding unit, generating a switching control signal and a selecting control signal according to an index value of one of the n bit lines;
  a plurality of switching units, each of the switching units having a first input terminal, a second input terminal, a first output terminal and a second output terminal, the first and the second input terminals of the $1^{st}$ switching unit respectively coupled to the $1^{st}$ bit line and a $k^{th}$ dummy line, the first and the second input terminals of the $i^{th}$ switching unit respectively coupled to the $i^{th}$ bit line and the first output terminal of the $(i-1)^{th}$ switching unit, $2 \leq i \leq m$, wherein each of the switching units conducts the first and the second input terminals to the first and the second output terminals respectively, or conducts the first and the second input terminals to the second and the first output terminals respectively according to the switching control signal; and
  a plurality of multiplexers, each of the multiplexers having a first input terminal and a second input terminal, the first and the second input terminals of the $j^{th}$ multiplexer respectively coupled to the second output terminal of the $(j+1)^{th}$ switching unit and the second output terminal of the $j^{th}$ switching unit, $1 \leq j \leq m-1$, the first and the second input terminals of the $m^{th}$ multiplexer respectively coupled to the first and the second output terminals of the $m^{th}$ switching unit, wherein each of the multiplexers selects a bit line of the first input terminal thereof or a bit line of the second input terminal thereof for signal transmission according to the selecting control signal,
  wherein, the $k^{th}$ repair module is coupled to the outputted m bit bus of $(k-1)^{th}$ repair module and the $k^{th}$ dummy line except the $1^{st}$ repair module is coupled to the m bit bus of the memory and a $1^{st}$ dummy line.

6. The repair device as claimed in claim 5, wherein the switching control signal comprises m bits, the $L^{th}$ switching unit conducts the first and the second input terminals thereof to the first and the second output terminals thereof respectively when the $L^{th}$ bit signal of the switching control signal has a first logic level, and the $L^{th}$ switching unit conducts the first and the second input terminals thereof to the second and the first output terminals thereof respectively when the $L^{th}$ bit signal of the switching control signal has a second logic level, and $1 \leq L \leq m$.

7. The repair device as claimed in claim 5, wherein the selecting control signal comprises m bits, the $L^{th}$ multiplexer selects the bit line of the first input terminal thereof when the $L^{th}$ bit signal of the selecting control signal has a first logic level, and the $L^{th}$ multiplexer selects the bit line of the second input terminal when the $L^{th}$ bit signal of the selecting control signal has a second logic level, and $1 \leq L \leq m$.

8. The repair device as claimed in claim 5, wherein the memory is static random access memory.

9. A repair method adapted to a memory for repairing one of n bit lines through m bit bus, $m \geq n$, comprising:

generating a switching control signal and a selecting control signal according to an index value of the one of n bit lines, wherein the switch control signal and the selecting control signal comprise n bits;

switching a dummy line to the one of n bit lines by shifting from $1^{st}$ bit line to the one of n bit lines one by one according to the switching control signal for replacing the one of n bit lines; and selecting the $L^{th}$ bit line or the dummy line for signal transmission according to the selecting control signal, wherein $1 \leq L \leq m$.

10. The repair method as claimed in claim 9, wherein the dummy line is switched to the $L^{th}$ bit line when the $L^{th}$ bit signal of the switch control signal has a first logic level, and the dummy line is not switched when the $L^{th}$ bit signal of the switch control signal has a second logic level.

11. The repair method as claimed in claim 10, wherein the $L^{th}$ bit line is selected to output when $L^{th}$ bit signal of the selecting control signal has a first logic level, and the dummy line is selected when the selecting control signal has a second logic level.

12. The repair method as claimed in claim 9, wherein the memory is static random access memory.

* * * * *